(12) United States Patent
Melanson et al.

(10) Patent No.: US 7,116,721 B1
(45) Date of Patent: Oct. 3, 2006

(54) DELTA-SIGMA MODULATORS WITH INTEGRAL DIGITAL LOW-PASS FILTERING

(75) Inventors: John Laurence Melanson, Austin, TX (US); Heling Yi, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 165 days.

(21) Appl. No.: 10/151,322

(22) Filed: May 20, 2002

(51) Int. Cl.
*H04B 14/06* (2006.01)
*H03M 3/02* (2006.01)

(52) U.S. Cl. .................... 375/247; 341/143
(58) Field of Classification Search ............ 375/245, 375/247; 341/110, 143, 144
See application file for complete search history.

(56) References Cited

U.S. PATENT DOCUMENTS

| | | | | |
|---|---|---|---|---|
| 5,392,042 A | * | 2/1995 | Pellon | 341/143 |
| 5,471,209 A | * | 11/1995 | Sutterlin et al. | 341/143 |
| 5,581,253 A | * | 12/1996 | Brown | 341/144 |
| 5,760,722 A | * | 6/1998 | Harris et al. | 341/143 |
| 5,825,253 A | * | 10/1998 | Mathe et al. | 331/18 |
| 5,877,716 A | | 3/1999 | Tagami | |
| 6,005,505 A | * | 12/1999 | Linz | 341/143 |
| 6,057,792 A | * | 5/2000 | Eastty et al. | 341/143 |
| 6,321,075 B1 | * | 11/2001 | Butterfield | 455/313 |
| 6,396,428 B1 | * | 5/2002 | Cheng | 341/143 |
| 6,590,943 B1 | * | 7/2003 | Ali | 375/332 |

OTHER PUBLICATIONS

Norsworthy et al., Delta-Sigma Data Converters, Theory, Design, and Simulation, IEEE Press 1997, pp. 172-183.
Proakis et al., Digital Signal Processing, Principles, Algorithms and Applications, Prentice Hall 1996, pp. 682-683.
Chen, Digital Signal Processing, Spectral Computation and Filter Design, Oxford University Press 2001, pp. 355-395.

* cited by examiner

*Primary Examiner*—Young T. Tse
(74) *Attorney, Agent, or Firm*—Thompson & Knight LLP; James J. Murphy

(57) ABSTRACT

A feedback noise-shaper of an order of at least three implements a first pole set defining a signal transfer function of a selected corner frequency and a second pole set having at least one pole at a frequency at least twice the selected corner frequency defining a noise transfer function.

28 Claims, 4 Drawing Sheets

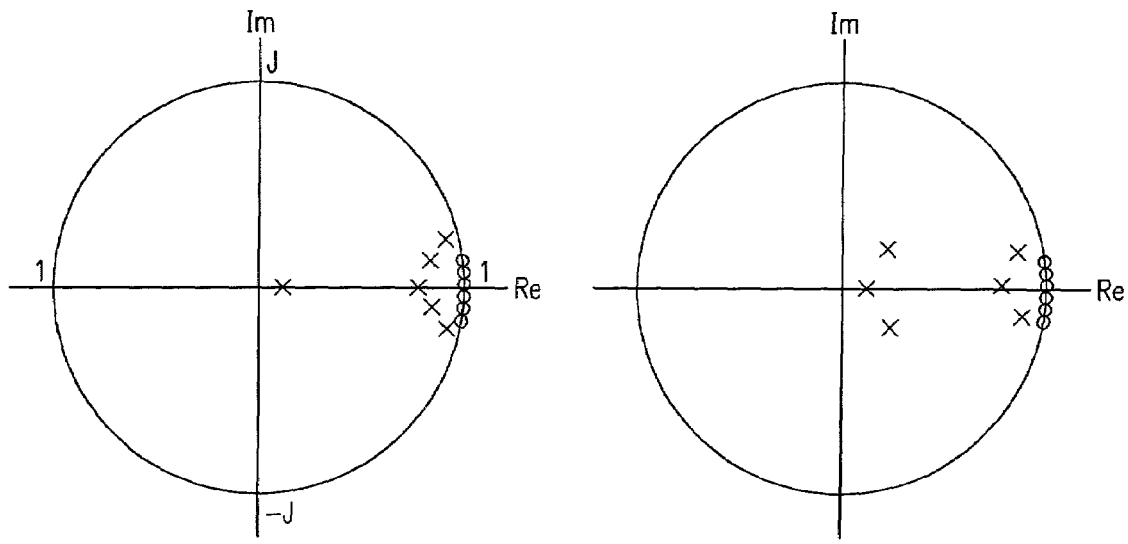
*FIG. 4A*  *FIG. 4B*
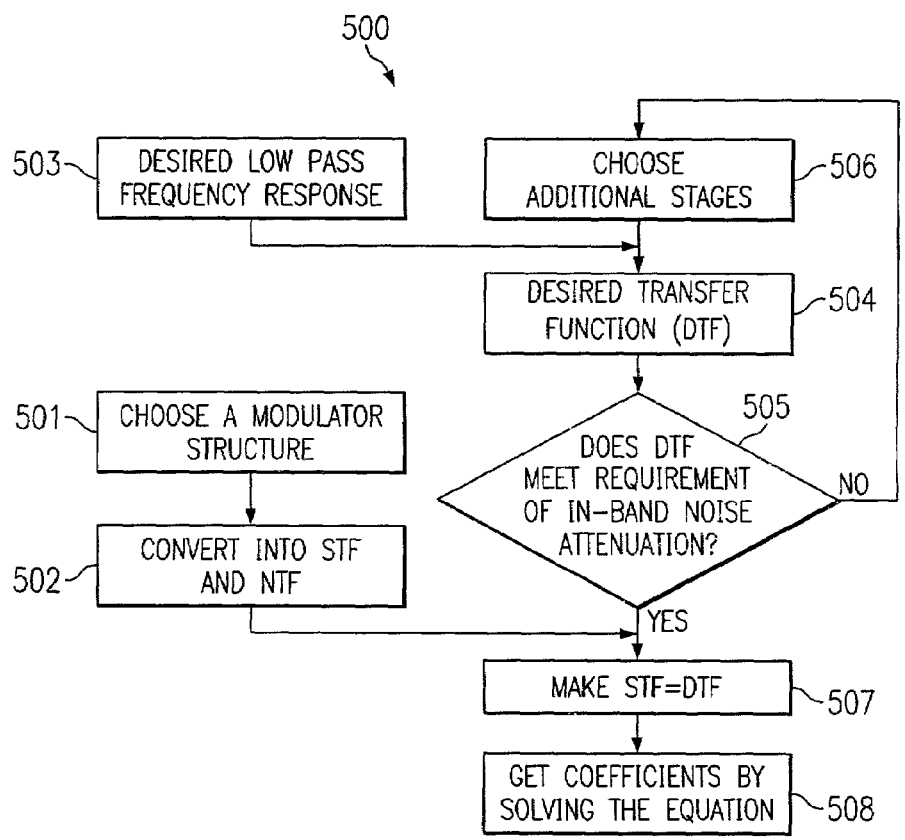
*FIG. 5*

DELTA-SIGMA MODULATORS WITH INTEGRAL DIGITAL LOW-PASS FILTERING

BACKGROUND OF THE INVENTION

1. Field of the Invention

The present invention relates in general to delta sigma modulators and in particular to delta sigma modulators with integral low-pass filtering.

2. Description of the Related Art

Delta-sigma modulators are particularly useful in digital to analog and analog to digital converters (DACs and ADCs). Using oversampling, the delta-sigma modulator spreads the quantization noise power across the oversampling frequency band, which is typically much greater than the input signal bandwidth. Additionally, the delta sigma modulator performs noise shaping by acting as a lowpass filter to the input signal and a highpass filter to the noise; most of the quantization noise power is thereby shifted out of the signal band.

The typical delta sigma modulator-based DAC includes a summer summing the input signal with negative feedback, a linear filter, a quantizer which driving the feedback loop, and a DAC generating the analog signal from the quantizer output. In a first order modulator, the linear filter comprises a single integrator stage while the linear filter in a higher order modulator comprises a cascade of a corresponding number of integrator stages. The quantizer can be either a one-bit or a multiple-bit quantizer. Higher-order modulators have improved quantization noise transfer characteristics over those of lower order modulators, although stability becomes a critical factor as the order increases.

Some applications, such as Super Audio Compact Disc (SACD) one-bit audio, are subject to significant out-of-band noise and therefore require either an external analog filter at the modulator output or an internal digital decimation filter. The analog filtering approach is expensive to implement with high accuracy and adds complexity to the overall design. Among other things, expensive precision components are required to obtain the Q factor defining the required flatness of the filter response in the proximity of the corner frequency. Digital filtering eliminates the problems of designing and building analog filters, but at the expense of significantly increased computational intensity.

Hence, some other technique is required if cost and simplicity are target design goals for delta sigma modulator data converters for use in applications with significant out-of-band noise.

SUMMARY OF THE INVENTION

The principles of the present invention are embodied in noise shapers, including delta-sigma modulators and delta-sigma data converters having integral digital low pass filtering. According to one embodiment, a feedback noise shaper is disclosed having an order of at least three. A first pole set defines a signal transfer function of a selected corner frequency and a second pole set having at least one pole at a frequency of at least twice the selected corner frequency defines a noise transfer function.

According to the inventive concepts, the signal transfer function of the delta-sigma modulator is carefully selected to provide low pass filtering of an input data stream. Consequently, high-Q analog filtering and/or computationally intensive digital filtering are no longer required. This delta-sigma modulator is particularly useful in applications such as one-bit audio which are subject to significant out-of-band noise and normally require external analog or internal digital filtering. The inventive concepts are demonstrated with respect to a sixth order system, built from a fifth-order Butterworth filter and a first-order higher frequency filter in a distributive feedback delta-sigma modulator, although other filter responses and/or modulator architectures may be used.

BRIEF DESCRIPTION OF THE DRAWINGS

For a more complete understanding of the present invention, and the advantages thereof, reference is now made to the following descriptions taken in conjunction with the accompanying drawings, in which:

FIGS. 4A and 4B are plots in the z-plane of the poles and zeros of the noise transfer function for the preferred and an alternate embodiment delta-sigma data converter, respectively; and FIG. 5 is a flow chart illustrating a procedure for designing a noise-shaper with integral signal filtering for a delta-sigma data converter according to the inventive concepts.

DESCRIPTION OF THE PREFERRED EMBODIMENTS

Figure 1:
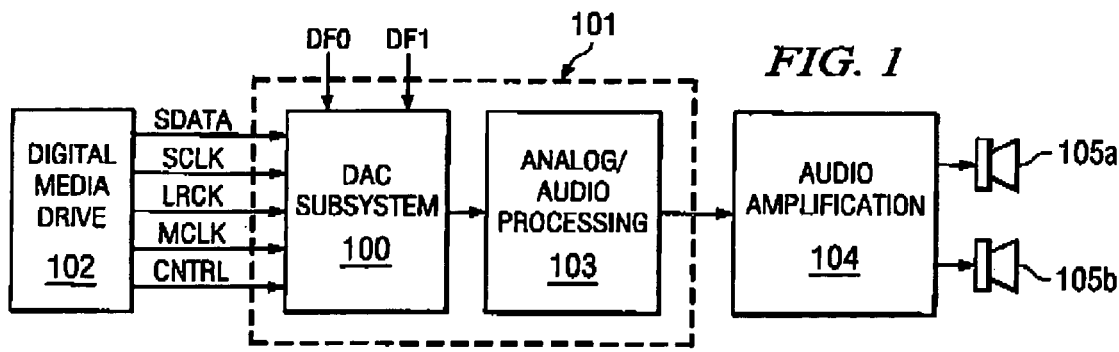
FIG. 1 is a high level functional block diagram of a Super-Audio Compact Disc audio system demonstrating a use of the analog to digital converter of FIG. 2.
Figure 2:
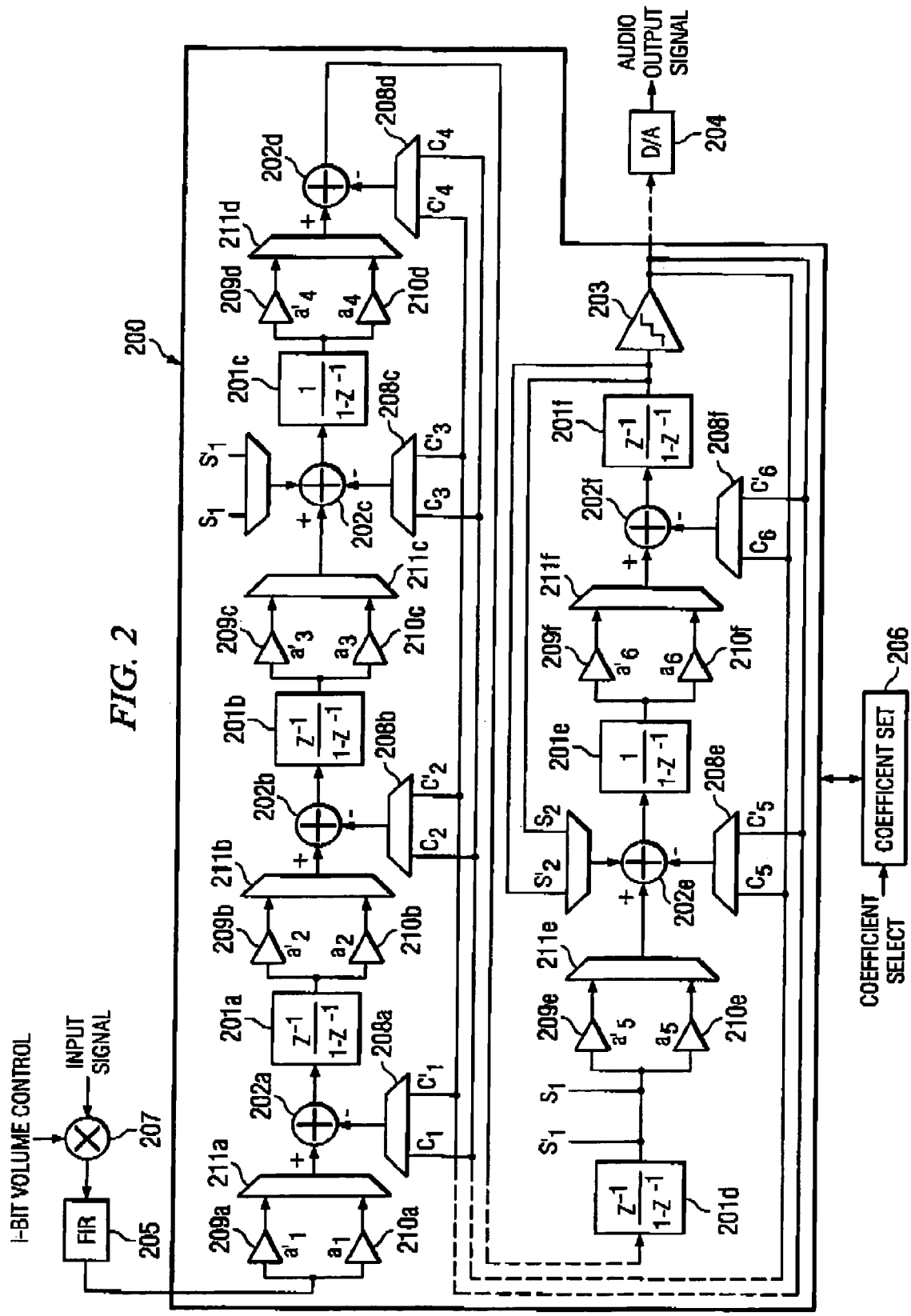
FIG. 2 is a functional block diagram of an exemplary delta-sigma data converter suitable for use in the analog to digital converter of FIG. 1.

The principles of the present invention and their advantages are best understood by referring to the illustrated embodiment depicted in FIGS. 1–3 of the drawings, in which like numbers designate like parts.

FIG. 1 is a diagram of a typical system application of 1-bit digital to analog converter (DAC) 100 according to the principles of the present invention. In this example, DAC subsystem 100 forms part of an audio component 101, such as a compact disk (CD) player, digital audio tape (DAT) player or digital video disk (DVD) unit. A digital media drive 102 recovers the digital data, for example 1-bit audio data in the Sony/Philips 1-bit format from the given digital data storage media, and passes those data, along with clocks and control signals, to DAC subsystem 100. The resulting analog (audio) data undergoes further processing in circuit block 103 prior amplification in amplifier block 104. Amplifier block 104 then drives a set of conventional speakers 105, a headset or the like.

Multi-bit digital audio data is received word-serial through the SDATA pin and serial interface/formal selector 101 timed by the sampling clock (SCLK). The left and right channel data are alternatively processed in response to the left-right clock (LRCLK). This clock is normally at the same rate at the data input rate (i.e., the sampling rate). Control signals DF1 and DF0 allow for the selection of the input format, for example, right or left justified, 20-bit or 24-bit word width, to name a few possibilities. When 1-bit data is being input, the SDATA port receives left channel data and the DF1 port right channel data. FIG. 1 also shows the audio master clock signal (MCLK) and general control line CNTRL.

FIG. 2 is an exemplary 6th order distributed-feedback delta-sigma modulator 200 based on six (6) integrator stages 201a–201f and associated summers 202a–202f and two local resonator feedback loops. The loop-filter equations and corresponding NTF and STF for this type of modulator, as well as for alternate configurations suitable for practicing the inventive principles, can be derived from the discussions of Norsworthy et al, *Delta-Sigma Converters, Theory, Design and Simulation*, IEEE Press (1997).

Quantizer 203 quantizes the modulated signal from the final integrator stage 201f. Quantizer 203 is typically a multiple-bit quantizer. The quantized data in turn drive a high-speed, low-resolution output DAC 204, for example a sixteen (16)-level DAC, which generates the analog output signal. The input data, such as one-bit audio or PCM data out of an interpolator, can be input directly into first stage 201a of the modulator 200 or through an optional finite impulse response (FIR) filter 205 described further below.

Typical delta sigma modulators are designed with a noise transfer function (NTF) for optimizing the noise shaping response described above. The associated signal transfer function (STF) is set to approximately unity gain or equalized or worked around elsewhere in the circuit. Normally, sufficient out-of-band gain is selected to drive in-band noise down to an acceptable level, typically 10 dB below the analog noise. The present inventive concepts however take advantage of the STF for filtering out-of-band noise in the input signal.

For discussion purposes, that one-bit audio data is assumed being processed at a 128*44100 Hz (5.6448 MHz) oversampling rate. Based on this assumption, the following exemplary filter coefficients, noise, signal transfer functions were developed. The data rate, the filter coefficients, and the transfer functions may vary from embodiment to embodiment without deviating from the inventive concepts. Moreover, the order and/or the configuration of the delta sigma modulator may vary from the preferred embodiment shown in FIG. 2. (For example, a feedforward or other known delta-sigma modulator architectures may be used in the alternative).

If a 50 kHz filter were used for the STF, the NTF would have insufficient in-band noise attenuation. Therefore, in modulator 200, the coefficients are selected to implement a STF filter with 50 kHz $5^{th}$ order Butterworth low pass poles and an additional pole at approximately 600 kHz. (See FIGS. 4A and 4B). (The characteristics of Butterworth low pass filters are described in most texts on digital signal processing, for example Proakis et al., *Digital Signal Processing Principles, Theory and Applications*, Prentice Hall, (1996)). The 600 kHz pole ensures that the NTF noise attenuation in the low pass band is sufficiently high. The coefficients for this embodiment are shown in

TABLE 1

TABLE 1 FEEDBACK COEFFICIENTS

| Coefficient | 5th Order Butterworth Poles, 50 kHz corner, 128 fs, fs = 44.1 kHz, Additional Pole at 600 kHz |
|---|---|
| C1 | $2.51692 \times 10^{-7}$ |
| C2 | 0.0000152454 |
| C3 | 0.00042963 |
| C4 | 0.00811408 |
| C5 | 0.0994375 |
| C6 | 0.595056 |

Figure 3A:
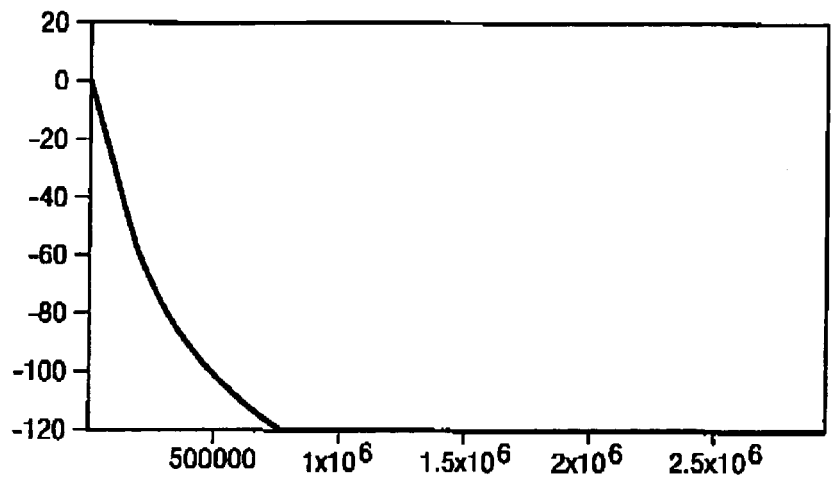
FIGS. 3A–3D are plots of the signal and noise transfer functions for the delta-sigma data converter of FIG. 2 for selected sets of coefficients and selected orders.
Figure 3B:
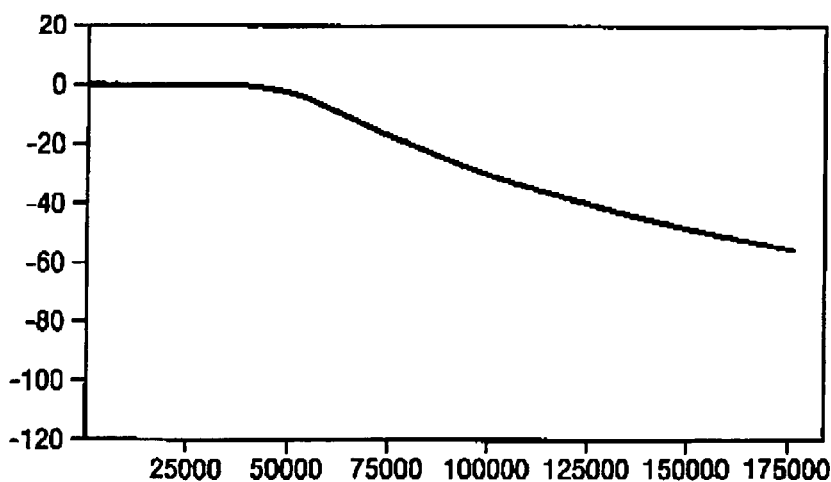
Figure 3C:
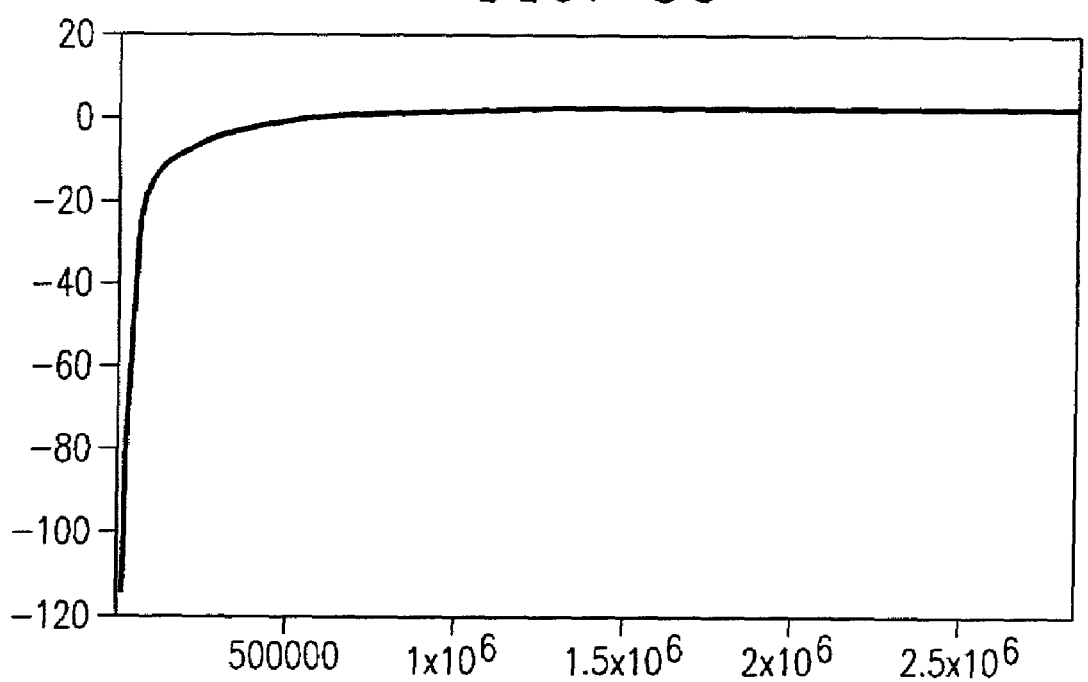
Figure 3D:
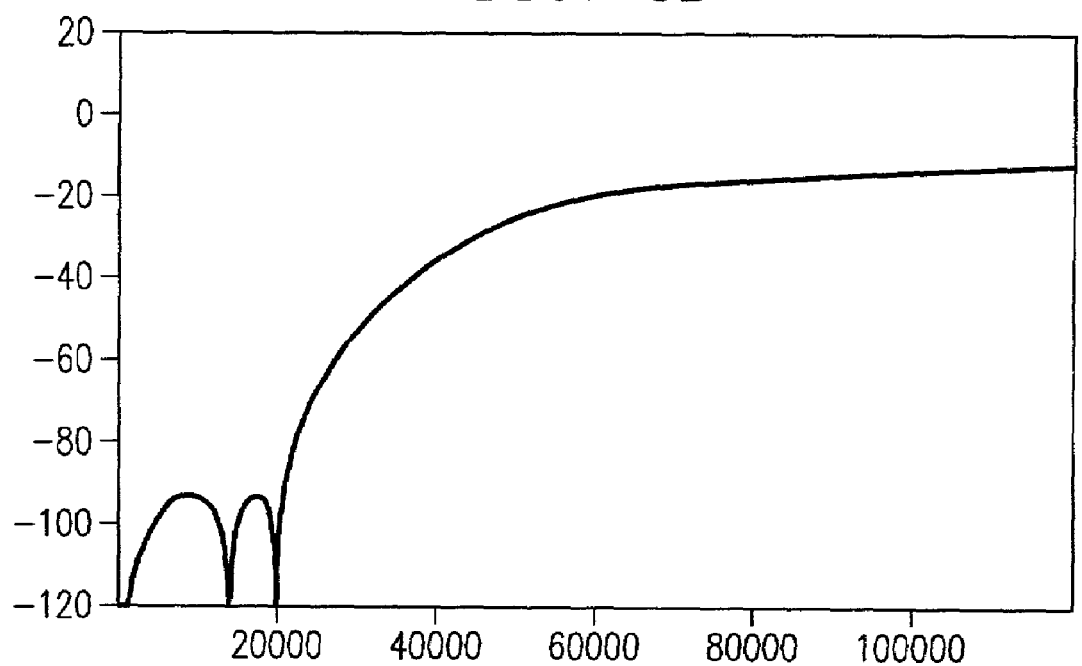

One method of deriving these coefficients is through the Mathmatica® code provided below. FIGS. 3A–3D are exemplary plots for the NTF and STF generated by this code for the coefficients and constraints of Table 1. Specifically, the signal transfer function is shown in FIGS. 3A and 3B, and FIG. 3B zooming-in on the low frequency signal pass band. As shown, the passband corner is at approximately 50 kHz and the gain rolls-off relatively quickly thereafter. Similar plots for the NTF are shown in FIGS. 3C and 3D. With respects to the NTF, good noise attenuation is provided in the audio band up to approximately 20 kHz. The modulator structure of FIG. 2, which includes two local resonator feedback loops S1 and S2, results in two zeros in the audio passband.

Referring back to FIG. 2, a non-volatile or volatile memory 206, or equivalent logic, may be included to support programmability of the modulator coefficients, and hence selectability of the STF pass-band. For example, one set of low-frequency coefficients could be stored for the one-bit audio application, and another set of high-frequency coefficients for 192 kHz PCM applications with a corner frequency around 200 KHz. Multiplexers 208a–208f or similar selector/switching circuitry are utilized for performing the coefficient selection. Additionally, since a change in coefficients may change the scale factors for each stage, a pair of corresponding amplifiers 209a–209f and 210a–210f and associated multiplexers 211a–211f are provided in front of each stage.

Optional FIR 205 may be a simple design with five zeros at the Nyquist frequency. If any additional output filtering is required, a simple analog R-C filter at the data converter output may be utilized. In any event, by embodying the primary filter function in the STF of the delta sigma modulator, the overall system is much less expensive and/or much less computationally intensive.

Additionally, in audio applications, volume control can be implemented with a relatively simple one-bit by n-bit multiplier 207 operating on the one-bit audio data at the front end of the converter.

A plot of the zeros and poles in the z-plane for the NTF in the preferred embodiment is provided in FIG. 4A. The poles of the STF are co-located with those of the NTF and hence have not been separately plotted. According to the inventive principles, two distinct sets of poles are used. For the exemplary sixth ($6^{th}$) order Butterworth filter and the coefficients provided in Table 1, the first pole set, providing the 50 kHz corner frequency and a relatively sharp roll-off, includes one (1) real pole and two complex-conjugate pole pairs at z=0.945838, 0.981579±0.0520094i, and 0.955454±0.0312881i. The additional pole (second pole set) for increasing the noise attenuation in the signal passband is set at z=0.48497 or approximately 600 kHz. The zeros of the NTF are generally shown on the unit circle with two of six zeros moved off the real axis by the resonator loops of FIG. 2.

Generally, the first set of poles is selected to set the STF corner frequency (here approximately 50 kHz) and the slope (roll-off) at the passband edge of the low-pass signal filter. While one (1) real and two complex pole-pairs are used to set the STF characteristics in this example, the number and type of poles can change from embodiment to embodiment. Preferably, the first pole set has at least two poles to define the STF which are preferrably complex to obtain a sufficiently sharp passband roll-off. While these poles are at the Butterworth locations, other pole locations (filter functions) and filter types, such as those used to obtain elliptical and Chebyshev functions can be used in the alternative.

The second pole or second set of poles is selected to improve the noise shaping function of the NTF, and particularly to increase the noise attenuation within the STF passband, as described above. Advantageously, by moving the second set of poles relative to the first set, the NTF can be tuned. In the illustrated embodiment, the second pole set comprises one real pole corresponding to a frequency of at least twice the STF cut-off frequency set by the first pole set (here 600 kHz). By moving this pole outward from the origin in the z-plane by reformulating the coefficient set, and therefore reducing the spacing of the first and second pole sets, the noise attenuation in the low frequency band will be reduced. On the other hand, the low frequency band NTF can generally be improved by moving this pole set towards the origin. The illustrated single real pole can moved to approximately the origin by when the coefficient of the last loop filter stage is approximately one (1).

As previously indicated, numerous alternate arrangements of the poles, as well as the zeros are possible, as illustrated in FIG. 4B. In this case, a sixth (6th) order modulator is represented with one real pole and one complex pole-pair set the STF low-response and one real pole and one complex pole-pair set the NTF.

FIG. 5 is a flow chart 500 of a procedure, which along with the code provided below, provide a methodology for designing a delta-sigma data converter with integral signal filtering according to the inventive concepts.

At Blocks 501 and 502, show steps of a modulator structure being selected and the equations for the corresponding NTF and STF being derived. Exemplary structures and characterizing equations are set out in Norsworthy et al., cited in full above. Again, in the illustrated embodiment, a feedback structure was selected with two resonators; equations for the NTF and STF for this structure are provided in the code set out below.

Block 503 shows the step of the desired low frequency response being selected for some initial number of loop-filter stages. From this selection, the initial desired transfer function is selected at block 504 and a determination is made as to whether this transfer function meets the in-band noise attenuation requirements for the signal at block 505. If it does not meet this requirement, then additional loop filter stages are added at block 506.

When the desired transfer function is achieved, the STF is defined to be equivalent to that of the transfer function at block 507. The coefficients are thereafter obtained at Block 508 by solving the equations for the NTF and STF for the selected structure and with the STF defined as the desired transfer function.

Although the present invention and its advantages have been described in detail, it should be understood that various changes, substitutions and alterations can be made herein without departing from the spirit and scope of the invention as defined by the appended claims.

APPENDIX

```
In [20]:=
    sdanalyze [ord_, ds_, nz_]:=
       Module [{c0, gg, a, bx, bn, cx, cn, dx, dn, izma, ceq, invm, hnn, hnx, afb, bfb},
       (*
           Analyze a delta sigma topology
           ord - order
           ds - ds description function
           nz - number of complex zero pairs
           Returns characteristic equation (poles),
           NTF numerator, STF numerator,
           state transition matrix for feedback, and b vector for feedback
        *)
        co = Table [c[i], {i, ord}]; gg = Table [g[i], {i, nz}];
```

APPENDIX-continued

```
        a = Transpose [Table[
           Module [{i=Table[1f[j == k, 1, 0], {k, ord}]},
               ds[i, 0, 0, co, gg, 0] [[1]]]
           {j, ord}]];
        bx = Module [{i = Table [0, {ord}]}, ds[i, 1, 0, 00, gg, 0] [[1]]];
        bn = Module [{i = Table [0, {ord}]}, ds[i, 0, 1, co, gg, 0] [[1]]];
        cx = cn = Table [Module[{i = Table [lf[j== k, 1, 0], {k, ord}]},
           ds [i, 0, 0, co, gg, 0] [[2]]]
           , {j, ord}];
        dx = Module [{i = Table [0, {ord}]}, ds[i, 1, 0, co, gg, 0] [[2]]];
        dn = Module [{i = Table [0, {ord}]}, ds[i, 0, 1, co, gg, 0] [[2]]];
        izma = Table [lf[j == k, 1, 0], {j, ord}, {k, ord}] - zm*a;
        ceq = Collect [Det [izma], zm];
        hnn = Simplify [dn*ceq+zm* (cn.Table[
           Simplify [Det[Transpose[ReplacePart[Transpose[izma], bn,
i]]]], {i, ord}])]
        hxn = Simplify [dx*ceq+zm* (cx.Table[Simplify[
           Det [Transpose[ReplacePart[Transpose[izma], bx, i]]]], {i,
ord}])];
        izma = .;
        afb = Transpose[Table[
           Module [{i = Table[lf[j == k, 1, 0], {k, ord}]},
               ds[i, 0, 0, co, gg, 1] [[1]]],
           , {j, ord}]];
        bfb = Module [{i = Table[0, {ord}]}, ds [i, 0, -1, co, gg, 0]
[[1]]];
        {ceq, hnn, hxn, afb, bfb}
        ];
In[21]:= solvecoef [fs_, fc_, n_, ceq_, zeros_, sp_ ] := Module [{1p,
pp, ceqc, bnc},
        (*
           Given a denominator polynomial, solve for the coeficients that
           give a butterworth responsed.
           sample freq,
           corner freq, order, poly in zm, local resonator feedbacks
           *)
        lp[fsl_, fc1_, n1_] := Module [{cp, cp1, pz, r, a1, r1},
        (*
           Make the z transform for a butterworth filter
           fsl - sample rate
           fc1 - corner frequency
           n1 - order
           *)
        cp1 = Together[(1−zm* (1+s1)/(1−s1)) * (1 − zm *
        (1 + s2)/(1 − s2))
/.
           {s1 −> r1*Cos [x] + r*r1*Sin[x],
            s2 −> r1*Cos [x] − l*r1*Sin[x]}];
        cp = Expand [Numerator[cp1]]/ Expand[Denominator[cp1]];
        rp = 1 − 1. * zm + (1 + s1) / (1 − s1)/.s1 −>−r1;
        (*.9999 to flatten freq response*)
        r := N[Tan [fc1/fs1*2*π/2]];
        pz := Product [cp/. x−>iπ/(2n1), {i, n1+1, 2n1−1, 2}]/;
        EvenQ[n1];
        pz := Product [cp/. x−>iπ/n1, {i, (n1+1)/2, n1−1}]*rp/;
        OddQ[n1];
        N[Collect[pz/. {r1−>r}, zm]]
        ];
        pp = lf[sp == 1, 1p[fs, fc, n], 1p[fs, fc*sp, 1] *1p[fs, fc, n−1]];
        ceqc = Flatten[Table[Coefficient[
        ceq/. Table[g[i] −> zeros[[i]], {i, Length[zeros]}], zm^i], {i, n}]];
        bnc = Table[Coefficient[pp, zm^i], {i, n}];
        First[
Table[c[i], {i, n}]/. Solve[Inner[Equal, ceqc, bnc, List], Table[c[i], {i,
n}]]]];
In[22]:= makeh[den_, num_, coef_, ze_] := Module[{s1, s2},
        s1 = Table[g[i] −> ze[[i]], {i, Length[ze]});
        s2 = Table[c[i] −> coef[[i]], {i, Length[coef]}];
        Simplify[num/.s1/.s2]/Simplify[den/.s1/.s2]
        ]
In[23]:= patrsp[fs_, ntf_, stf_] := Module[{res, ww, sres},
        res[x_] = ntf/.zm−>x; sres[x_] = stf/.zm−>x;
        Print["Noise Transfer Function=\n", ntf];
        Print["Signal Transfer Function=\n", stf];
        ww = N[2*π*l/fs];
        Print["Sample Rate=", fs];
        Print["Nyquest noise gain =", res [−1]];
        Print["noise reduction to 20k =",
           10*Log[10, NIntegrate[Abs[res[Exp[ww*x]]]^2, {x, 20,
```

APPENDIX-continued

```
            20000}] / (fs/2)]];
        Plot[20*Log10, Abs[res[Exp[ww*x]]]], {x, 0, fs/2},
PlotRange -> {-120, 20},
        GridLines -> Automatic, ImageSize -> 72*5,
        PlotLabel -> "NTF"];
        Plot[20*Log10, Abs[sres[Exp[ww*x]]]], {x, 0, fs/2},
PlotRange -> {-120, 20},
        GridLines -> Automatic, ImageSize -> 72*5,
        PlotLabel -> "STF"];
        Plot[20*Log10, Abs[res[Exp[ww*x]]]], {x, 0, fs/32},
PlotRange -> {-120, 20},
        GridLines -> Automatic, ImageSize -> 72*5,
PlotLabel -> "NTF ZOOM"];
    Plot [20*Log10, Abs[sres[Exp[ww*x]]]], {x, 0, fs/32},
PlotRange -> {-120, 20},
        GridLines -> Automatic, ImageSize -> 72*5, PlotLabel -> "STF
ZOOM"];
    ];
In[24]:
    5th Order DSD re-modulator
    (*Define the topology of a modulator
    ii = starting state (list)
    x = input (scalar)
    ns = quantization "noise" (scalar)
    co = list of coeffecients
    g = local resonator gains
    fb = 1 to close loop, 0 open *)
    ds5[ii_, x_, ns_, co_, g_, fb_] := Module [{i0, i1, i2, i3, i4, y},
        i0 = ii[[1]]; i1 = ii[[2]]; i2 = ii[[3]]; i3 = ii[[4]]; i4 = ii[[5]];
        y = lf[fb == 1, ns, i4=ns];
        i0 += (x-y) * co[[1]];
        i1 += i0 + i2*g[[1]] - y*co[[2]];
        i2 += i1 - y+co[[3]];
        i3 += i2+i4*g[[2]]- y*co[[4]];
        i4 += i3 - y*co[[5]];
        {{i0, i1, i2, i3, i4}, y}    ];
In[25] := desc5 = sdanalyze[5, ds5, 2];
    gl = {-1./8192, -1./2048}; (*NTF zeros*)
    fs = 44100*128;
    ctab5 = solvecoef[fs, 50000, 5, desc5[[1]], gl, 1];
    ntf5 = makeh[desc5[[1]], desc5[[2]], ctab5, gl];
    stf5 = makeh[desc5[[1]], desc5[[3]], ctab5, gl] * ((.5+.5*zm)^1);
In[31] :=
    6th Order DSD re-modulator
        ds6[ii_, x_, ns_, co_, g_, fb_] := Module [{i0, i1,
i2, i3, i4, i5, y},
        i0 = ii[[1]]; i1 = ii[[2]]; i2 = ii[[3]]; i3 = ii[[4]]; i4 = ii[[5]];
        i5 = ii[[6]];
        y = lf[fb == 1, ns, i5 + ns];
        i4 += i3 + i5*g[[3]] - y*co[[5]];
        i5 += i4 - y*co[[6]];
        i2 += i1 + i3*g[[2]] - y*co[[3]];
        i3 += i2 - y*co[[4]];
        i1 += i0 + (-y) * co[[2]];
        i0 += (x-y) co[[1]] + i1*g[[1]];
        {{i0, i1, i2, i3, i4, i5}, y}    ];
In[32] := desc6 = sdanalyze[6, ds6, 3];
    gl = {0, -2, ^-12, -2. ^-11); (*NTF zeros*)
    ctab6 = solvecoef[fs, 50000, 6, desc6[[1]], gl, 12];
    ntf6 = makeh[desc6[[1]], desc6[[2]], ctab6, gl];
    stf6 = makeh[desc6[[1]], desc6[[3]], ctab6, gl];
In[37] := Print ["coefficients = ", ctab5]; patrsp[fs, ntf5, stf5];
    Print ["coefficients = ", ctab6]; patrsp[fs, ntf6, stf6];
    coefficients = {4.88599×10⁻⁷, 0.0000259205, 0.000779239,
0.0138403, 0.164839}
    Noise Transfer Function=
```

$$\frac{1.19737\ (-1+zm)\ (1-1.99988\ zm+zm^2)\ (1-1.99951\ zm+zm^2}{(-1.05726+zm)(1.09425-2.091\ zm+zm^2)(1.03498-2.03183\ zm+zm^2)}$$

Signal Transfer Function=

$$\frac{5.85035 \times 10^{-7}\ (0.5 + 0.5\ zm)\ zm}{(-1.05726 + zm)(1.09425 - 2.091\ zm+zm^2)(1.03498 - 2.03183\ zm+zm^2)}$$

Sample Rate=5644800
Nyquest noise gain = 1.09408
    noise reduction to 20k = -85.2997

What is claimed is:

1. A feedback noise-shaper comprising:
   a loop-filter having at least three stages for modulating an input signal;
   a quantizer for quantizing an output signal from the loop-filter; and
   feedback circuitry providing feedback from an output of the quantizer to the loop-filter stages, the feedback to the loop-filter stages weighted by a set of coefficients implementing a first pole set defining a signal transfer function of a selected corner frequency and a second pole set having at least one pole at a frequency at least twice the selected corner frequency defining a noise transfer function.

2. The feedback noise-shaper of claim 1 comprising a delta-sigma modulator of an order of at least three.

3. The feedback noise-shaper of claim 1 wherein the first pole set comprises at least first and second poles at Butterworth locations.

4. The feedback noise-shaper of claim 1 wherein the second pole set comprises at least one real pole.

5. The feedback noise-shaper of claim 1 where the order is six with the first pole set comprising five Butterworth low pass filter poles and the second pole set comprises a pole at a frequency substantially above a corner frequency of a low pass filter response corresponding to a Butterworth low pass filter.

6. A method of noise shaping comprising the steps of:
   selecting a first pole set defining a signal transfer function for generating a response of a selected corner frequency and a signal passband of a feedback noise-shaper of an order of at least three; and
   selecting a second pole set for improving a corresponding noise transfer function of the noise-shaper, wherein the second pole set comprises at least one pole at a frequency above the selected corner frequency for attenuating noise in the signal passband.

7. The method of claim 6 wherein said step of selecting the first pole set comprises the stop of selecting a set of Butterworth low pass filter poles.

8. The method of claim 6 wherein said step of selecting the second pole set comprises the step of selecting at least one real pole at the frequency above the selected corner frequency.

9. The method of claim 6 wherein said step of selecting the second pole set comprises the step of selecting at least one pole at a frequency at least twice the selected corner frequency.

10. The method of claim 6 further comprising the step of selecting a topology of the noise-shaper to be delta-sigma modulator topology.

11. A delta-sigma modulator comprising:
    a loop-filer comprising a plurality of stages for modulating an input signal;
    a quantizer for quantizing a signal output from a loop-filter output; and
    a plurality of feedback paths for weights feedback to inputs of the stages of an output signal from said quantizer, said weights corresponding to a set of coefficients selected to implement a first pole set for defining a signal transfer function having a corner frequency and a second pole set with a pole at a frequency at least twice the corner frequency for defining a noise transfer function.

12. The delta-sigma modulator of claim 11 wherein said stages of said loop-filter comprise integrator stages.

13. The delta-sigma modulator of claim 11 wherein said first pole set comprises a set of Butterworth low-pass filter poles.

14. The delta-sigma modulator of claim 13 wherein the low-pass filter poles correspond to the corner frequency at approximately 50 kHz.

15. The delta-sigma modulator of claim 13 wherein the second pole set comprises a real pole.

16. The delta-sigma modulator of claim 15 wherein the first pole set defines a $5^{th}$ order Butterworth response.

17. The delta-sigma modulator of claim 11 wherein the second pole set includes at least one pole at a frequency substantially above the corner frequency selected to increase noise attenuation in a low frequency passband.

18. The delta-sigma modulator of claim 11 wherein the set of coefficients is selected from a plurality of sets of coefficients available to program the signal transfer function of said delta-sigma modulator.

19. The delta-sigma modulator of claim 18 wherein the set of coefficients is selected in response to a change in input signal type.

20. The delta-sigma modulator of claim 18 wherein the set of coefficients is selected in response to a change in sample frequency.

21. The delta-sigma modulator of claim 11 operable in a selected one of one-bit and PCM modes.

22. A data converter for converting a digital input stream containing out-of-band noise to an analog output comprising:
  a delta-sigma modulator having noise and signal transfer functions, the signal transfer function producing a response having a corner frequency and signal passband and defined by a first set of poles and the noise transfer function producing a response improved by at least one additional pole at a frequency substantially greater than said corner frequency for attenuating noise in the signal passband; and
  a digital to analog converter for converting a filtered output from the delta-sigma modulator into analog form.

23. The data converter of claim 22 wherein the digital to analog converter comprises a low-resolution, high speed digital to analog converter.

24. The data converter of claim 22 wherein the digital input stream comprises one-bit digital audio.

25. The data converter of claim 24 further comprising a multiplier for multiplying the one-bit digital audio input stream to implement volume control.

26. The data converter of claim 22 wherein shared poles of the noise and signal transfer functions are at Butterworth locations.

27. The date converter of claim 22 further comprising circuitry for selecting filter coefficients for setting the poles of the noise and signal transfer functions.

28. The data converter of claim 22 further comprising a FIR filter in front of the delta-sigma modulator for filtering the digital input data stream.

* * * * *